(12) United States Patent
Lin et al.

(10) Patent No.: US 8,912,014 B1
(45) Date of Patent: Dec. 16, 2014

(54) CONTROLLING THE LATCHUP EFFECT

(75) Inventors: Chuan Lin, Cupertino, CA (US);
Dong-Hyuk Ju, Cupertino, CA (US);
Imran Khan, Santa Clara, CA (US);
Jun Kang, San Jose, CA (US); Shibly S. Ahmed, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 1617 days.

(21) Appl. No.: 11/333,208

(22) Filed: Jan. 18, 2006

(51) Int. Cl.
*H01L 21/66* (2006.01)

(52) U.S. Cl.
USPC .............................. 438/14; 438/17

(58) Field of Classification Search
USPC ............... 438/14, 17; 257/139, 372, E27.063
See application file for complete search history.

(56) References Cited

U.S. PATENT DOCUMENTS

| | | | | |
|---|---|---|---|---|
| 5,534,461 A | * | 7/1996 | Kuwajima | 438/645 |
| 5,843,796 A | * | 12/1998 | Disney | 438/133 |
| 5,901,065 A | * | 5/1999 | Guruswamy et al. | 716/8 |
| 6,407,445 B1 | * | 6/2002 | Vashchenko et al. | 257/630 |
| 6,509,585 B2 | * | 1/2003 | Huang | 257/173 |
| 2002/0144213 A1 | * | 10/2002 | Ramaswamy et al. | 716/2 |
| 2003/0003637 A1 | * | 1/2003 | Ninomiya | 438/173 |
| 2005/0085028 A1 | * | 4/2005 | Chatty et al. | 438/200 |
| 2005/0240886 A1 | * | 10/2005 | Bonges et al. | 716/4 |
| 2005/0269634 A1 | * | 12/2005 | Bojarczuk et al. | 257/338 |
| 2006/0022229 A1 | * | 2/2006 | Sumita | 257/288 |

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

*Primary Examiner* — Kevin Parendo
(74) *Attorney, Agent, or Firm* — Harrity & Harrity, LLP

(57) ABSTRACT

A method includes varying spacing between at least one of a source region or a drain region and a well contact region to create a group of configurations. The method further includes determining an effect of latchup on each configuration.

4 Claims, 14 Drawing Sheets

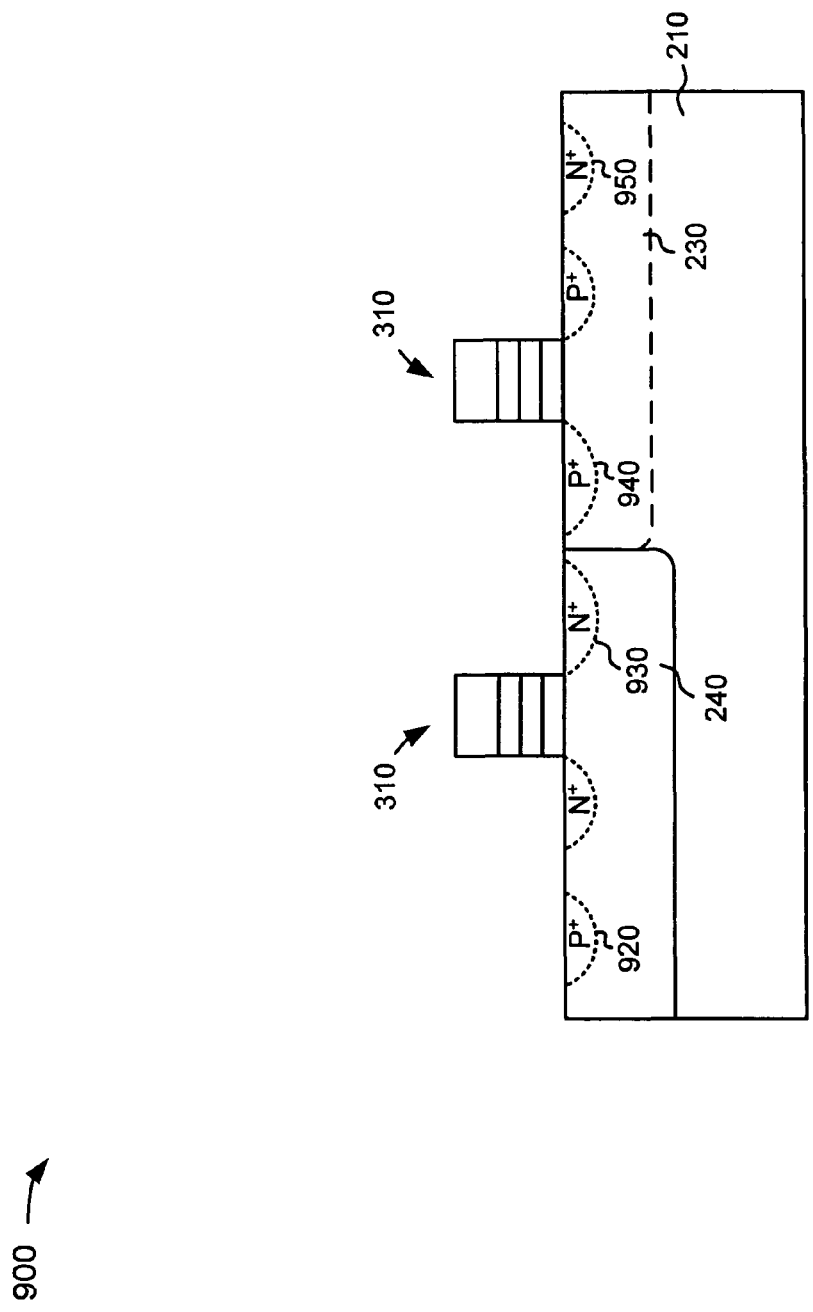

US 8,912,014 B1

CONTROLLING THE LATCHUP EFFECT

FIELD OF THE INVENTION

Implementations consistent with the principles of the invention relate generally to semiconductor devices and methods of manufacturing semiconductor devices. The invention has particular applicability to limiting the effect of latchup.

BACKGROUND OF THE INVENTION

The escalating demands for high density and performance associated with semiconductor devices require small design features, high reliability, and increased manufacturing throughput. As design features continue to shrink, the latchup effect becomes more prevalent in semiconductor devices.

The latchup effect creates a low resistance path between the positive and negative voltage supplies of a Complementary Metal Oxide Semiconductor (CMOS) circuit and enables the flow of large currents through the affected circuit. When latchup occurs, the circuit stops functioning and may even be destroyed because of the heat developed by the large currents. Therefore, designers seek to control or eliminate the latchup effect.

SUMMARY OF THE INVENTION

In an implementation consistent with the principles of the invention, a method includes varying spacing between at least one of a source region or a drain region and a well contact region to create a group of configurations. The method further includes determining an effect of latchup on each configuration.

In another implementation consistent with the principles of the invention, a method includes varying dimensions of at least one of a source region or a drain region and a well contact region to create a group of configurations. The group of configurations includes at least two of a first configuration where a length of the at least one of a source region or a drain region is greater than a length of the well contact region and a width of the at least one of a source region or a drain region is substantially similar to a width of the well contact region, a second configuration where a length of the at least one of a source region or a drain region is shorter than a length of the well contact region and a width of the at least one of a source region or a drain region is substantially similar to a width of the well contact region, a third configuration where a length and a width of the at least one of a source region or a drain region are greater than a length and a width of the well contact region, or a fourth configuration where a width of the at least one of a source region or a drain region is greater than a width of the well contact region and a length of the at least one of a source region or a drain region is substantially similar to a length of the well contact region. The method further includes determining an effect of latchup on each configuration in the group of configurations.

In yet another implementation consistent with the principles of the invention, a method includes varying dimensions of at least one of a source region or a drain region and a well contact region and a distance between the at least one of a source region or a drain region and the well contact region to create a group of configurations. The method further includes determining an effect of latchup on each configuration in the group of configurations.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 9A-9B illustrate exemplary views for forming a latchup monitor in still another implementation consistent with the principles of the invention.

DETAILED DESCRIPTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Latchup Monitor Configuration

Figure 1A:
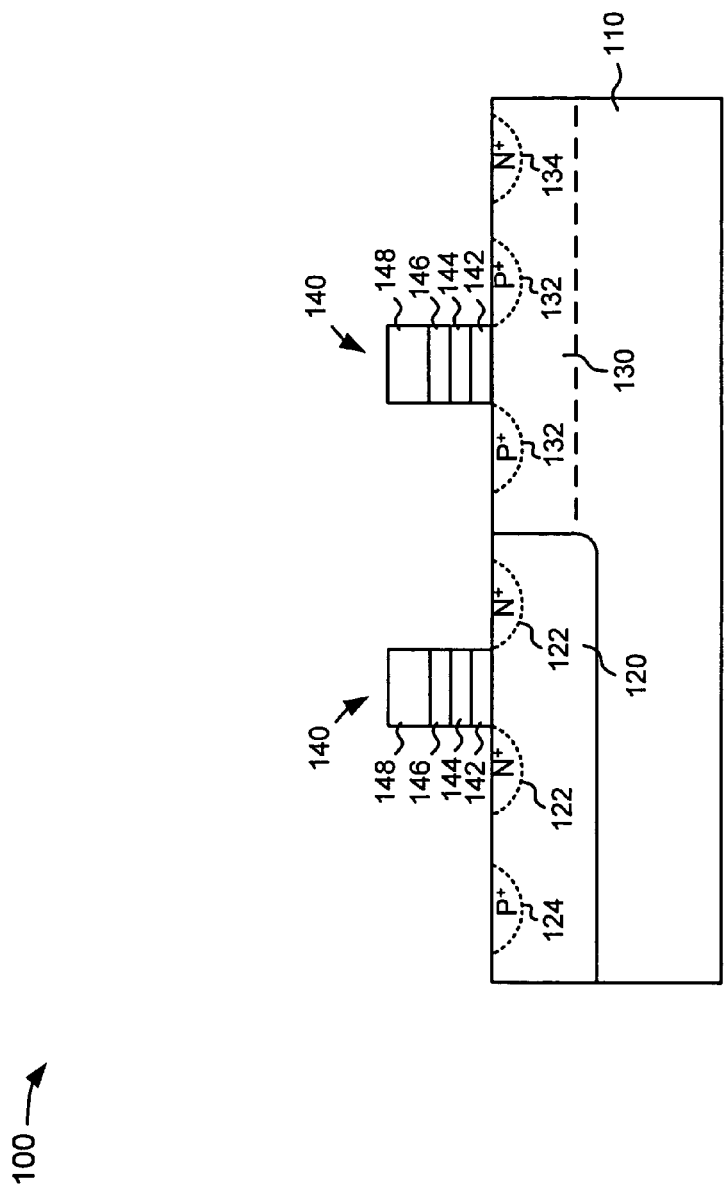
FIGS. 1A and 1B illustrate exemplary views of a latchup monitor.
Figure 1B:
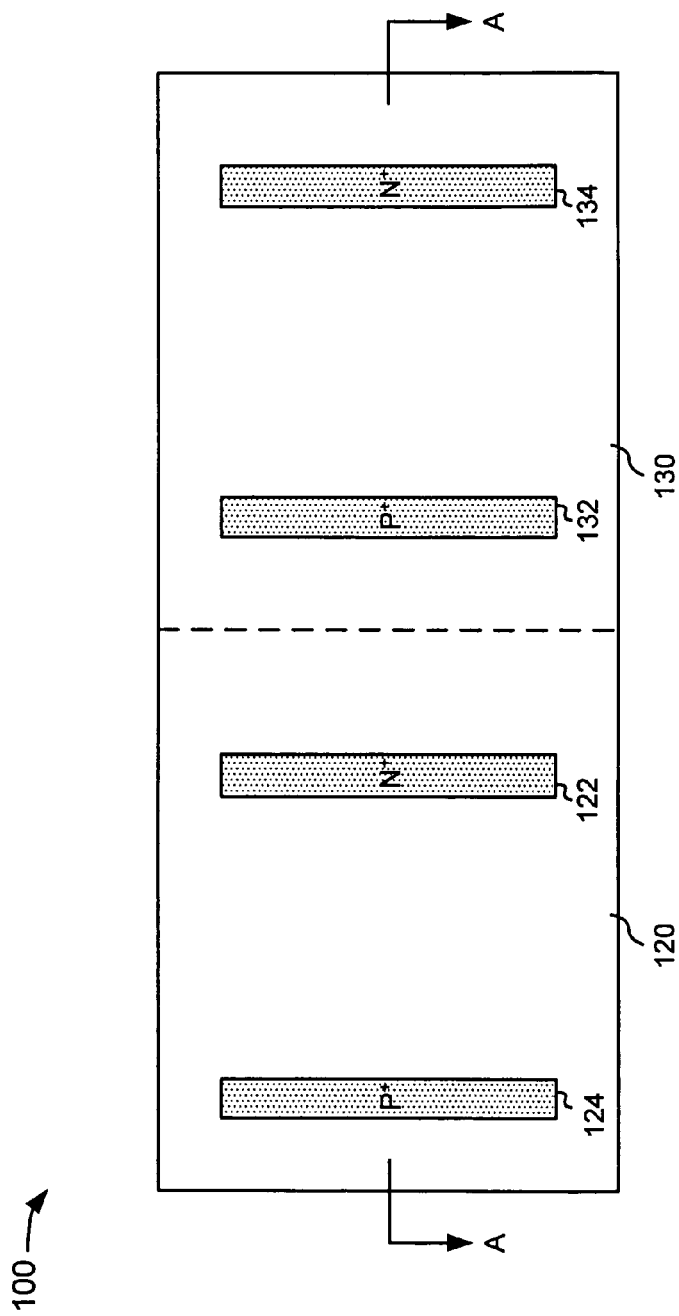

FIGS. 1A and 1B illustrate exemplary views of a latchup monitor 100. In one implementation, latchup monitor 100 is formed in a semiconductor memory device (e.g., a flash memory device). FIG. 1B illustrates a top view of a portion of latchup monitor 100. FIG. 1A illustrates a cross section of latchup monitor 100 taken along line A-A in FIG. 1B.

With reference to FIG. 1A, latchup monitor 100 may include a layer 110, having wells 120 and 130 (also referred to herein as "tubs") formed therein. For explanatory purposes only, layer 110 may include a lightly doped P over a heavily doped p+ substrate or P substrate, tub 120 may include a p-tub (i.e., a tub doped with p-type impurities), and tub 130 may include an n-tub (i.e., a tub doped with n-type impurities). While FIG. 1A illustrates a twin tub design, it will be appreciated that, alternatively, a single p-tub or n-tub may be formed in an n-type substrate or p-type substrate, respectively.

Source and drain regions 122 and a well region 124 may be formed in p-tub 120. Source and drain regions 122 may be doped with n-type impurities, such as phosphorous or arsenic, and well region 124 may be doped with p-type impurities, such as boron. Source and drain regions 122 and well region 124 may be formed to a width of 0.3 µm or larger.

Similarly, source and drain regions 132 and a well region 134 may be formed in n-tub 130. Source and drain regions 132 may be doped with p-type impurities, such as boron, and well region 134 may be doped with n-type impurities, such as phosphorous or arsenic. Source and drain regions 132 and well region 134 may be formed to a width of 0.3 µm or larger.

Memory cells 140 may be formed on a top surface of p-tub 120 and n-tub 130. Memory cells 140 may include a first dielectric layer 142 that acts as a tunnel oxide layer, a charge storage layer 144, a second dielectric layer 146 that acts as an inter-gate dielectric, and a conductive layer 148 that may be used to form a control gate electrode.

As illustrated in the top view of FIG. 1B, source/drain regions 122 and 132 and well regions 124 and 134 may be formed to a length of 10 µm. A distance between well region 124 and source/drain region 122 may range from 10 μm to 100 μm. A distance between source/drain region 122 and source/drain region 132 may range from 0.8 μm to 2 μm. A distance between source/drain region 132 and well region 134 may range from 10 μm to 100 μm. Latchup monitor 100 may be used to measure latchup associated with memory cells 140.

Exemplary Alternative Latchup Monitor Configurations

FIGS. 2-9B illustrate various latchup monitor configurations consistent with the principles of the invention. While the following description focuses on the formation of latchup monitors in semiconductor memory devices, it will be appreciated that the latchup monitor configurations described herein may alternatively be formed in other types of semiconductor devices that experience latchup, such as transistor devices.

Figure 2:
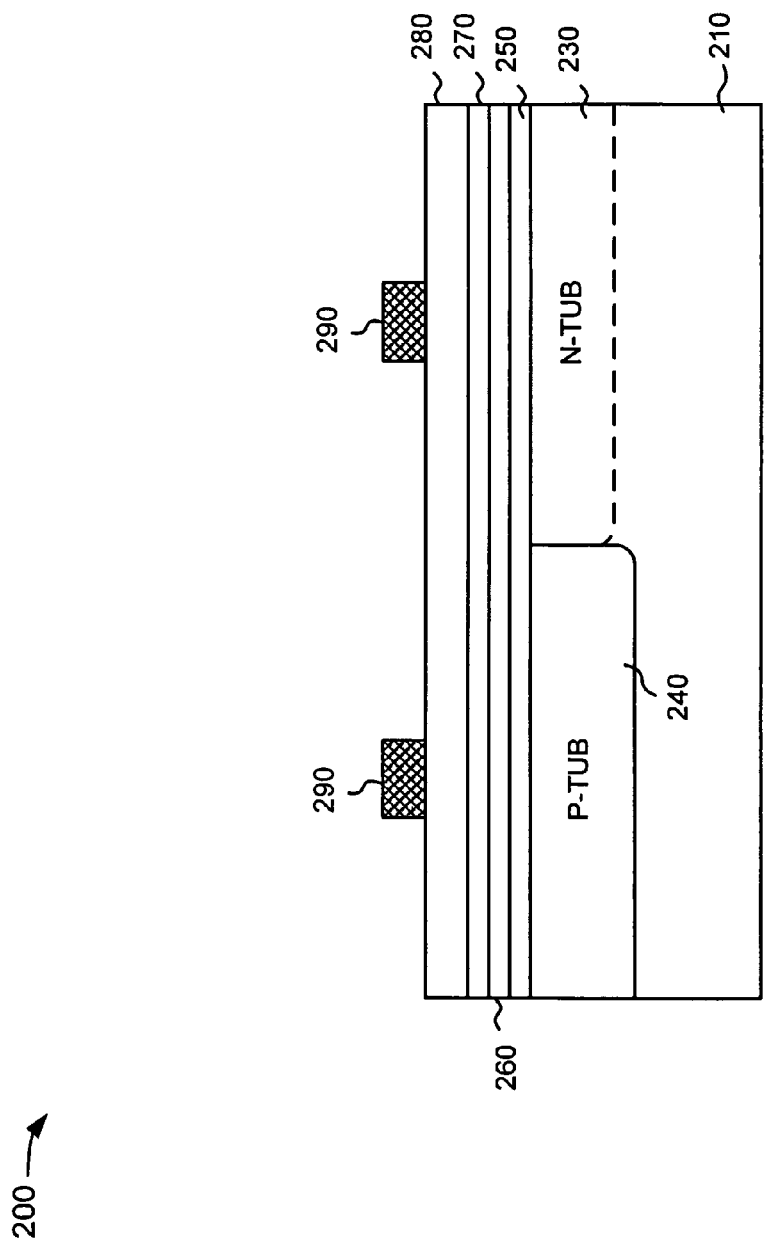
FIGS. 2-6B illustrate exemplary views for forming a latchup monitor in an implementation consistent with the principles of the invention.

FIGS. 2-6B illustrate exemplary views for forming a latchup monitor in a first implementation consistent with the principles of the invention. Processing may begin with a semiconductor device 200, as illustrated in FIG. 2, that includes layers 210, 250, 260, 270, and 280. In an exemplary implementation, layer 210 may include a substrate of semiconductor device 200 and may include silicon, germanium, silicon-germanium or other semiconducting materials. In alternative implementations, layer 210 may be a conductive layer or a dielectric layer formed a number of layers above the surface of a substrate in semiconductor device 200. In one implementation, layer 110 may include a lightly doped n-type (or p-type substrate) over a heavily doped n-type (or p-type) substrate or a p-substrate.

One or more wells (also referred to herein as "tubs") may be formed in layer 110. In the exemplary implementation illustrated in FIG. 2, two tubs 230 and 240 may be formed in layer 110 in a conventional manner. Tub 230 may, for example, include an n-tub (i.e., a tub doped with n-type impurities) and tub 240 may, for example, include a p-tub (i.e., a tub doped with p-type impurities). While FIG. 2 illustrates a twin tub design, it will be appreciated that, in other implementations consistent with the principles of the invention, a single p-tub or n-tub may be formed in an n-type substrate or p-type substrate, respectively.

Layer 250 may be a dielectric layer formed on layer 210 in a conventional manner. In an exemplary implementation, dielectric layer 250 may include an oxide, such as a silicon oxide (e.g., $SiO_2$), and may have a thickness ranging from about 20 Å to about 120 Å. Dielectric layer 250 may function as a tunnel oxide layer for a subsequently formed memory cell of semiconductor device 200.

Layer 260 may be formed on layer 250 in a conventional manner and may include a dielectric material, such as a nitride (e.g., a silicon nitride), an oxide, such as $Al_2O_3$ or $HfO_2$, etc. Layer 260, consistent with the invention, may act as a charge storage layer for semiconductor device 200 and may have a thickness ranging from about 30 Å to about 150 Å. Alternatively, layer 260 may include a conductive material, such as polycrystalline silicon, used to form a floating gate electrode for semiconductor device 200.

Layer 270 may be optional. If layer 270 is needed, layer 270 may be formed on layer 260 in a conventional manner and may include a dielectric material, such as an oxide (e.g., $SiO_2$). Alternatively, layer 270 may include another dielectric material, such as a silicon oxynitride, that may be deposited or thermally grown on layer 260. In still other alternatives, layer 270 may be a composite that includes a number of dielectric layers or films. Layer 270 may have a thickness ranging from about 50 Å to about 200 Å and may function as an inter-gate dielectric for memory cells in semiconductor device 200.

Layer 280 may be formed on layer 270 in a conventional manner and may include a conductive layer, such as polycrystalline silicon. Alternatively, conductive layer 280 may include other semiconducting materials, such as germanium or silicon-germanium, or various metals, such as titanium or tungsten. In an exemplary implementation, conductive layer 280 may have a thickness ranging from about 1000 Å to about 2000 Å. Conductive layer 280, consistent with the invention, may be used to form one or more control gate electrodes for one or more memory cells in semiconductor device 200. An optional silicide layer, such as titanium silicide or CoSi (not shown) may be formed on conductive layer 280.

A photoresist material may be patterned and etched to form mask 290 on the top surface of conductive layer 280. Mask 290 may be used to facilitate formation of one or memory cells in semiconductor device 200, as described in more detail below. The length and pattern of mask 290 may be selected based on the particular end device requirements.

Figure 3:
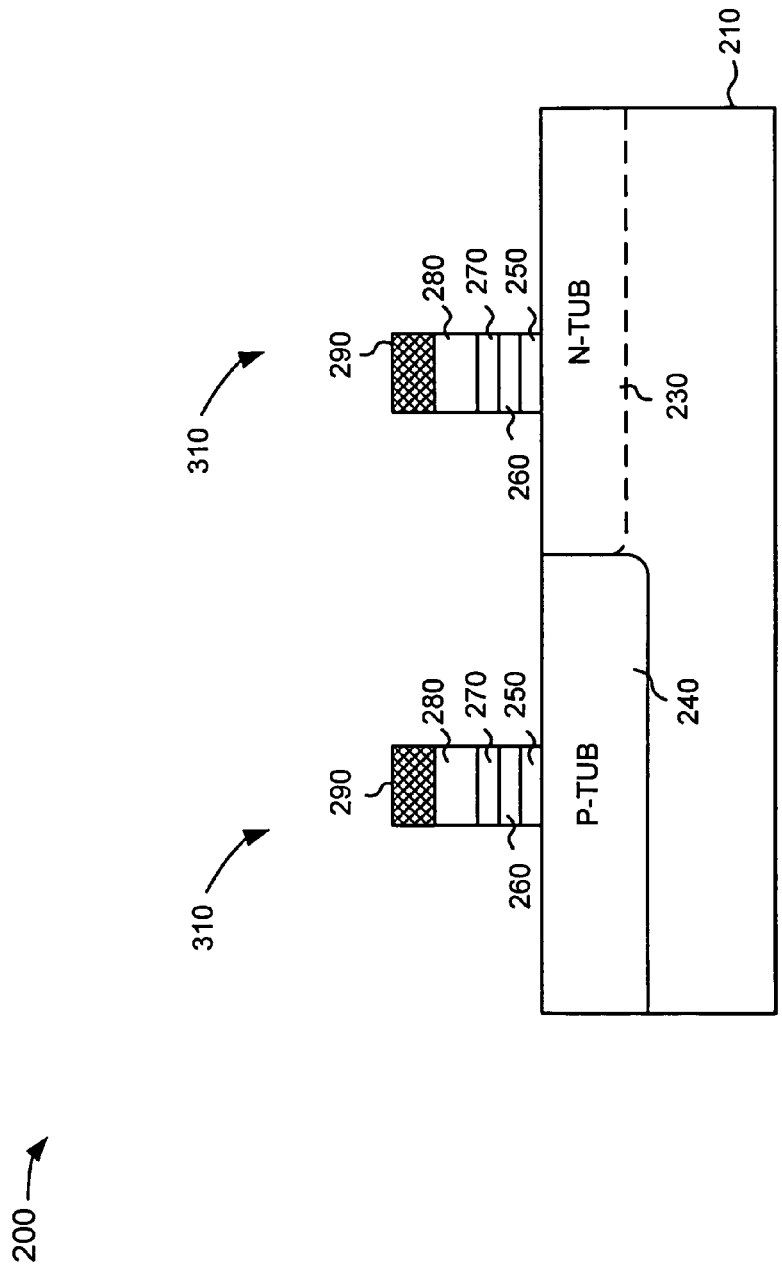

Semiconductor device 200 may then be etched, as illustrated in FIG. 3. Referring to FIG. 3, layers 250-280 may be etched in a conventional manner with the etching terminating at substrate 210, thereby forming structures 310. Alternatively, the etching may terminate at another layer, such as layer 260. Structures 310 (also referred to herein as "memory cells 310") may represent memory cells of semiconductor device 200, where memory cells 310 include a dielectric layer 250, a charge storage layer 260, an inter-gate dielectric layer 270, and a control gate electrode 280.

Figure 4:
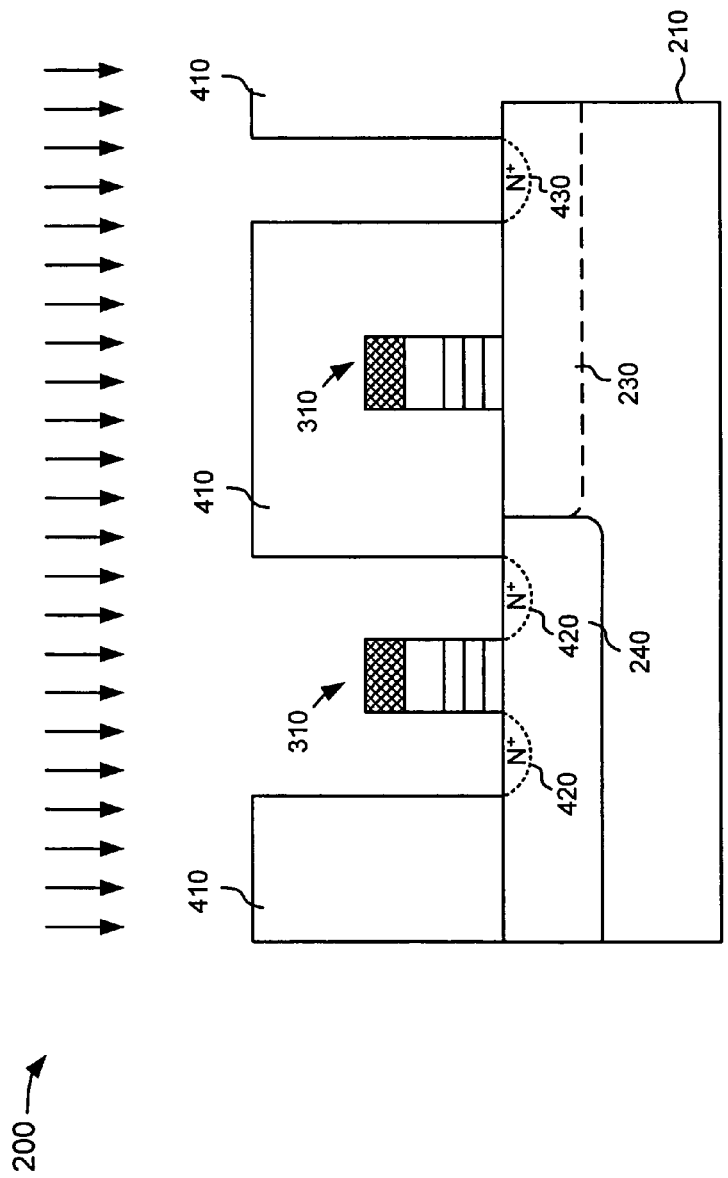

Source and drain regions and well contact regions may be formed in n-tub 230 and p-tub 240. For example, a protective layer 410, such as a $SiO_2$ layer, may be formed on semiconductor device 200 in a conventional manner, as illustrated in FIG. 4. Protective layer 410 may serve to protect semiconductor device 200 during the source/drain and well implant process. In one implementation, n-type impurities may be implanted in p-tub 240 to form source and drain regions 420, based on the particular end device requirements. N-type impurities may also be implanted in n-tub 230 to form well contact region 430. In one implementation, an n-type dopant, such as phosphorous or arsenic, may be implanted at a dosage ranging from about $1 \times 10^{15}$ atoms/$cm^2$ to about $5 \times 10^{15}$ atoms/$cm^2$ and an implantation energy ranging from about 30 KeV to about 60 KeV. One of ordinary skill in the art would be able to optimize the source/drain and well implantation process based on the particular circuit requirements. It should also be understood that source and drain regions 420 and well contact region 430 may alternatively be formed at other points in the fabrication process of semiconductor device 200.

In one implementation, source and drain regions 420 may be formed to a width of approximately 0.5 μm. Similarly, well contact region 430 may be formed to a width of approximately 0.5 μm. It will be appreciated that source/drain regions 420 and well contact region 430 may be formed to other widths in other implementations consistent with the principles of the invention.

Figure 5:
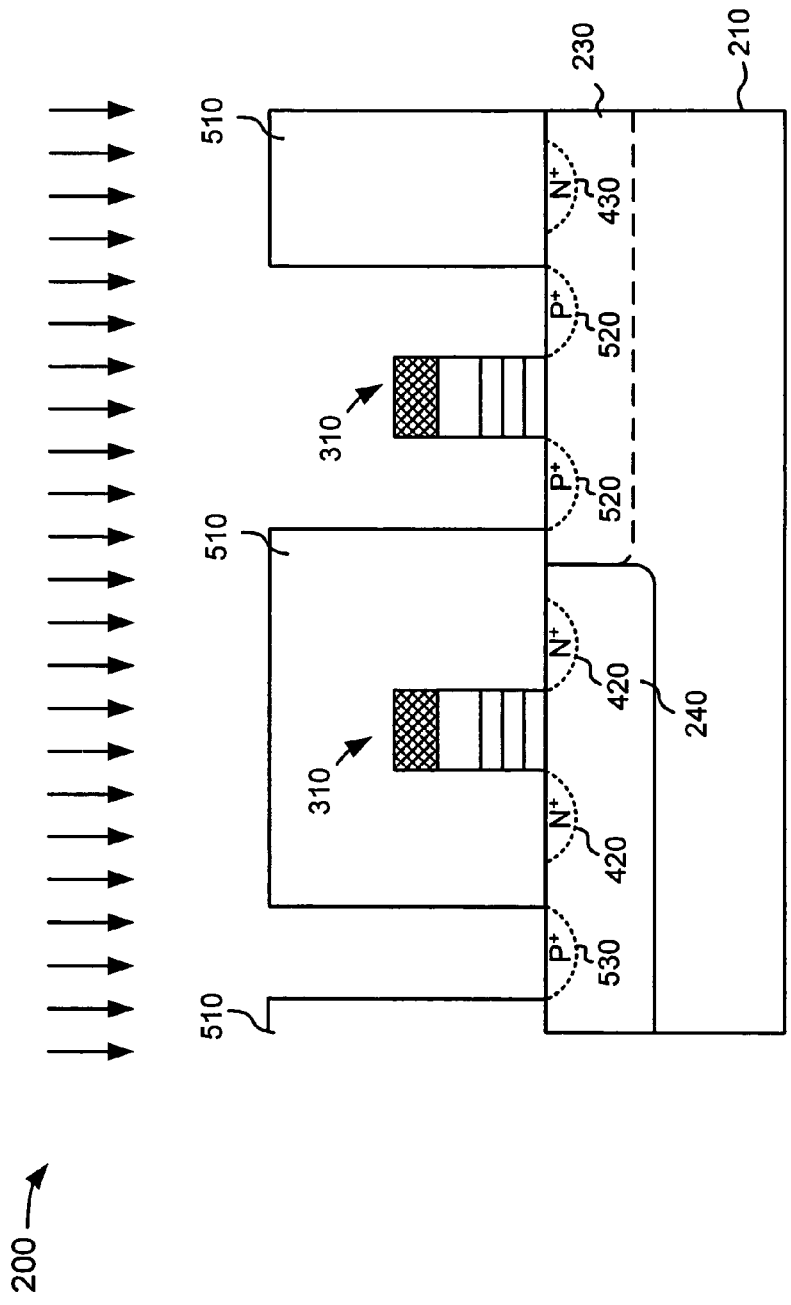

Protective layer 410 may be removed via a conventional process and a protective layer 510, such as a $SiO_2$ layer, may be formed on semiconductor device 200 in a conventional manner, as illustrated in FIG. 5. Protective layer 510 may serve to protect semiconductor device 200 during the following source/drain and well implant process. In one implementation, p-type impurities may be implanted in n-tub 230 to form source and drain regions 520, based on the particular end device requirements. P-type impurities may also be implanted in p-tub 240 to form well contact region 530. In one implementation, a p-type dopant, such as boron, may be implanted at a dosage ranging from about $1\times10^{15}$ atoms/cm$^2$ to about $5\times10^{15}$ atoms/cm$^2$ and an implantation energy ranging from about 8 KeV to about 20 KeV. One of ordinary skill in the art would be able to optimize the source/drain and well implantation process based on the particular circuit requirements. It should also be understood that source and drain regions 520 and well contact region 530 may alternatively be formed at other points in the fabrication process of semiconductor device 200.

In one implementation, source and drain regions 520 may be formed to a width of approximately 0.5 μm. Similarly, well contact region 530 may be formed to a width of approximately 0.5 μm. It will be appreciated that source/drain regions 520 and well contact region 530 may be formed to other widths in other implementations consistent with the principles of the invention.

Figure 6A:
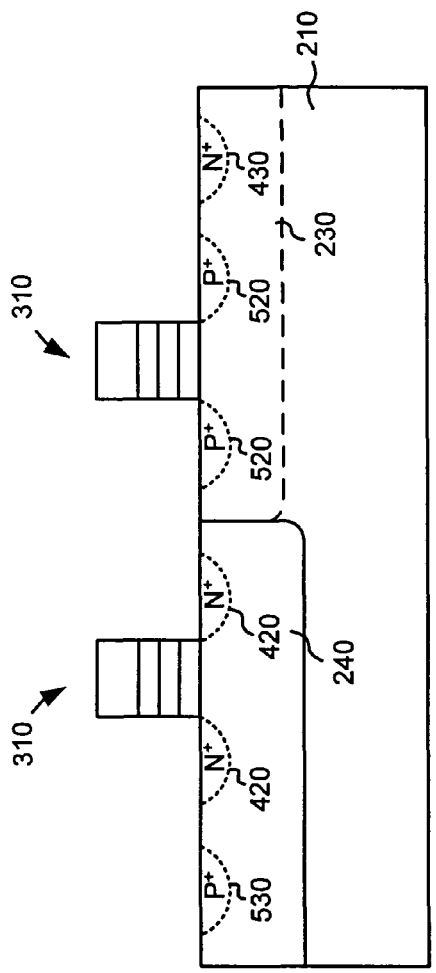
Figure 6B:
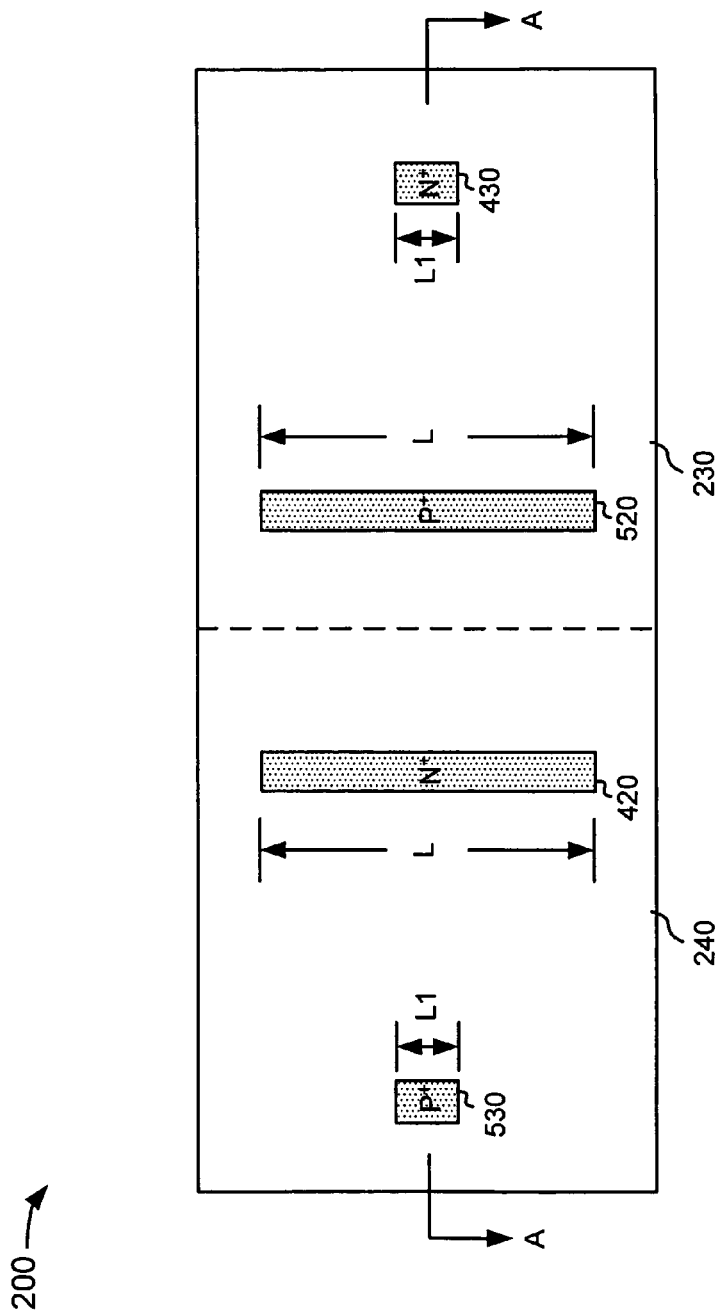

Protective layer 510 and mask 290 may be removed, as illustrated in FIG. 6A and the top view illustrated in FIG. 6B. FIG. 6A is taken along line A-A of FIG. 6B. As illustrated in the top view of FIG. 6B, the length of source/drain regions 420 and 520 may exceed the length of p-well contact region 530 and n-well contact region 430. In an implementation consistent with the principles of the invention, source/drain regions 420 and 520 may be formed to a length (L) ranging from about 1 μm to about 100 μm. In one implementation consistent with the principles of the invention, source/drain regions 420 and 520 may be formed to a length of about 10 μm. In an implementation consistent with the principles of the invention, n-well contact region 430 and p-well contact region 530 may be formed to a length ranging from about 0.3 μm to about 10 μm. In one implementation consistent with the principles of the invention, n-well contact region 430 and p-well contact region 530 may be formed to a length (L1) of about 0.5 μm. A lateral distance between p-well contact region 530 and source/drain region 420 may range, for example, from about 10 μm and about 100 μm. A lateral distance between source/drain region 420 and source/drain region 520 may range, for example, from about 0.8 μm and about 2 μm. A lateral distance between source/drain region 520 and n-well contact region 430 may range, for example, from about 10 μm and about 100 μm.

Therefore, in this first exemplary implementation consistent with the principles of the invention, well contact regions may be formed to a shorter length than source/drain regions. The impact of this exemplary configuration on latchup may be analyzed. For example, at the fixed well contact region length L1, a maximum length L of source/drain regions 420 and 520 that may be implemented without latchup may be determined. As the source/drain region length increases, the small size of the well contact region will not, at some point, be effective to prevent latchup. Therefore, this structure aids in determining how frequent the well contact region is needed in a real circuit to prevent latchup.

Figure 7A:
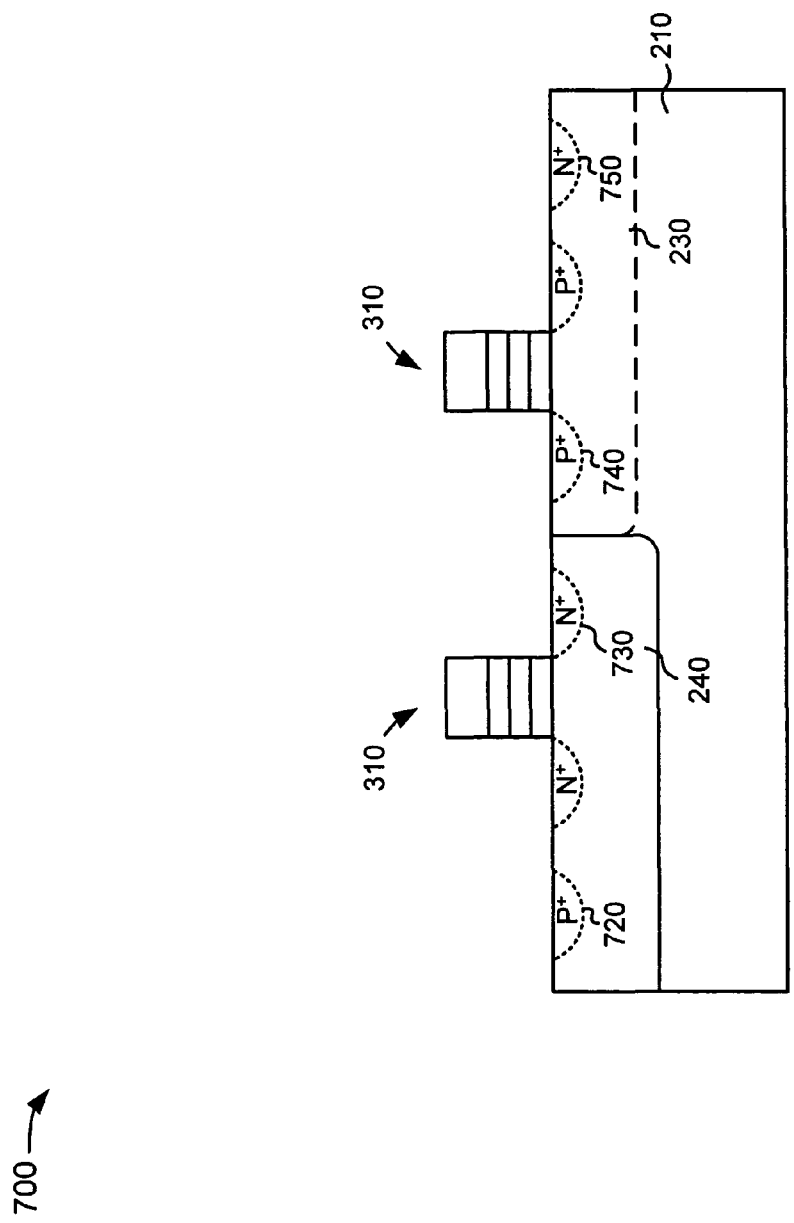
FIGS. 7A-7B illustrate exemplary views for forming a latchup monitor in another implementation consistent with the principles of the invention.
Figure 7B:
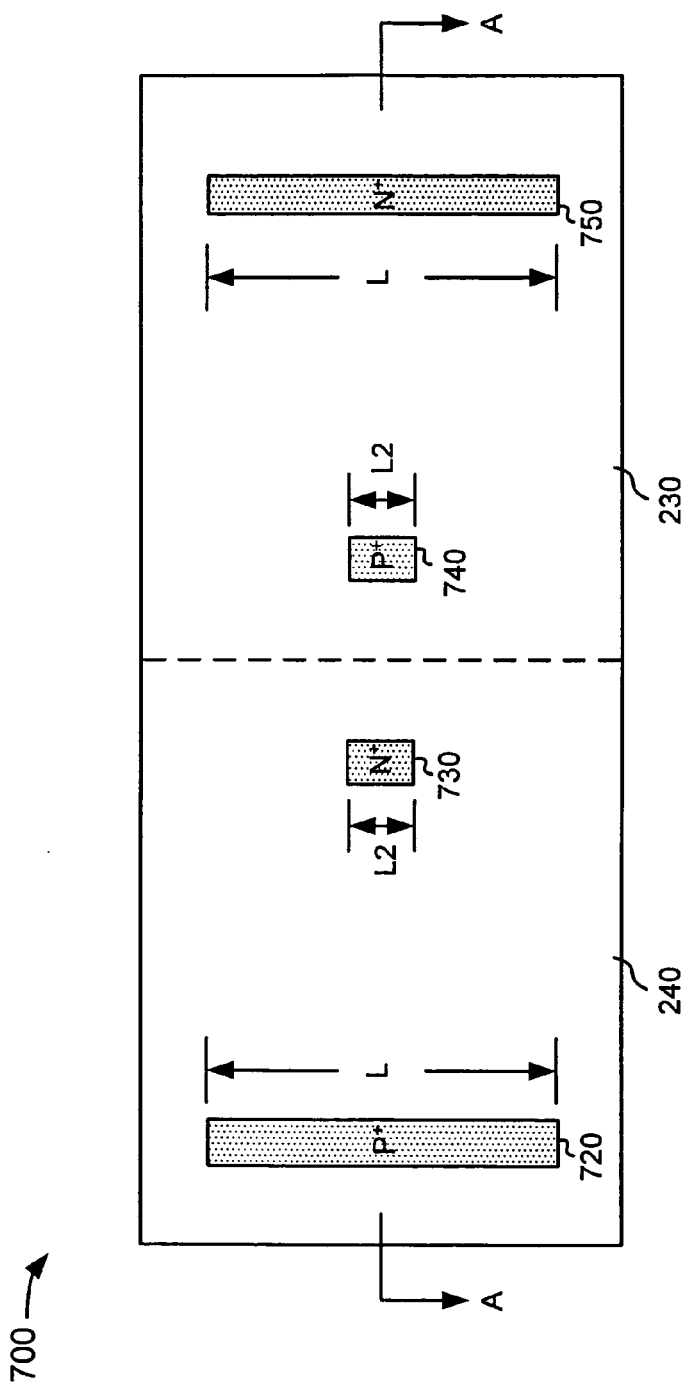

FIGS. 7A-7B illustrate exemplary views for forming a latchup monitor in a second exemplary implementation consistent with the principles of the invention. Processing may begin with a semiconductor device 700, as illustrated in FIG. 7A, that is formed in a manner similar to semiconductor device 200 described above with respect to FIGS. 2-5. As set forth above with respect to FIGS. 2-5, a memory cell 310 may be formed on a top surface of a p-tub 240 formed in a layer 210. Source/drain regions 730 may be formed in p-tub 240 by implanting n-type impurities into p-tub 240. Also, a p-well contact region 720 may be formed in p-tub 240 by implanting p-type impurities into p-tub 240. A memory cell 310 may be formed on a top surface of an n-tub 230 formed in a layer 210. Source/drain regions 740 may be formed in n-tub 230 by implanting p-type impurities into n-tub 230. Also, an n-well contact region 750 may be formed in n-tub 230 by implanting n-type impurities into n-tub 230.

In the exemplary implementation illustrated in FIG. 7A and the top view illustrated in FIG. 7B, source/drain regions are formed to a shorter length than the well contact regions. FIG. 7A is taken along line A-A of FIG. 7B. In this implementation, a width of well contact regions 720 and 750 and source/drain regions 730 and 740 may be substantially similar. In one implementation, the width may be approximately 0.5 μm. P-well contact region 720 and n-well contact region 750, consistent with the invention, may be formed to a length ranging from about 0.5 μm to about 10 μm. In one implementation consistent with the principles of the invention, p-well contact region 720 and n-well contact region 750 may be formed to a length (L) of about 10 μm. Source/drain regions 730 and 740, consistent with the invention, may be formed to a length ranging from about 0.5 μm to about 100 μm. In one implementation consistent with the principles of the invention, source/drain regions 730 and 740 may be formed to a length (L2) of about 0.5 μm. A lateral distance between p-well contact region 720 and source/drain region 730 may range, for example, from about 10 μm and about 100 μm. A lateral distance between source/drain region 730 and source/drain region 740 may range, for example, from about 0.8 μm and about 2 μm. A lateral distance between source/drain region 740 and n-well contact region 750 may range, for example, from about 10 μm and about 100 μm.

Therefore, in this second exemplary implementation consistent with the principles of the invention, source/drain regions may be formed to a shorter length than well contact regions. The impact of this exemplary configuration on latchup may be analyzed. It will be appreciated that some parts of a circuit are more sensitive to latchup than the rest of the circuit due to operating conditions and functioning of the circuit. One way to reduce latchup is to reduce resistance between the well contact region and the source/drain region by increasing the size of the well contact region. Therefore, in this implementation, at a fixed source/drain length L2, this structure aids in determining a minimum length L of the well contact region that may be used in the latchup-sensitive part of a circuit without latchup.

Figure 8A:
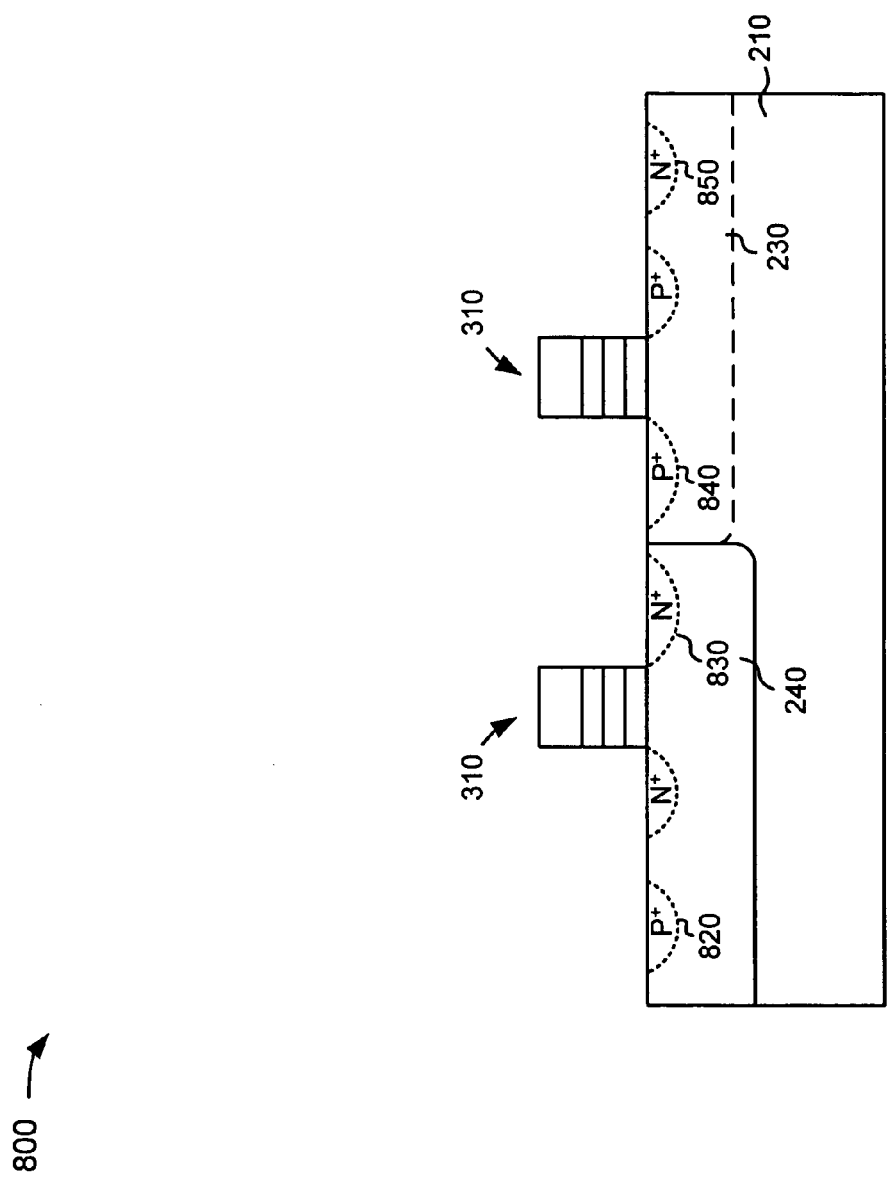
FIGS. 8A-8B illustrate exemplary views for forming a latchup monitor in a further implementation consistent with the principles of the invention.
Figure 8B:
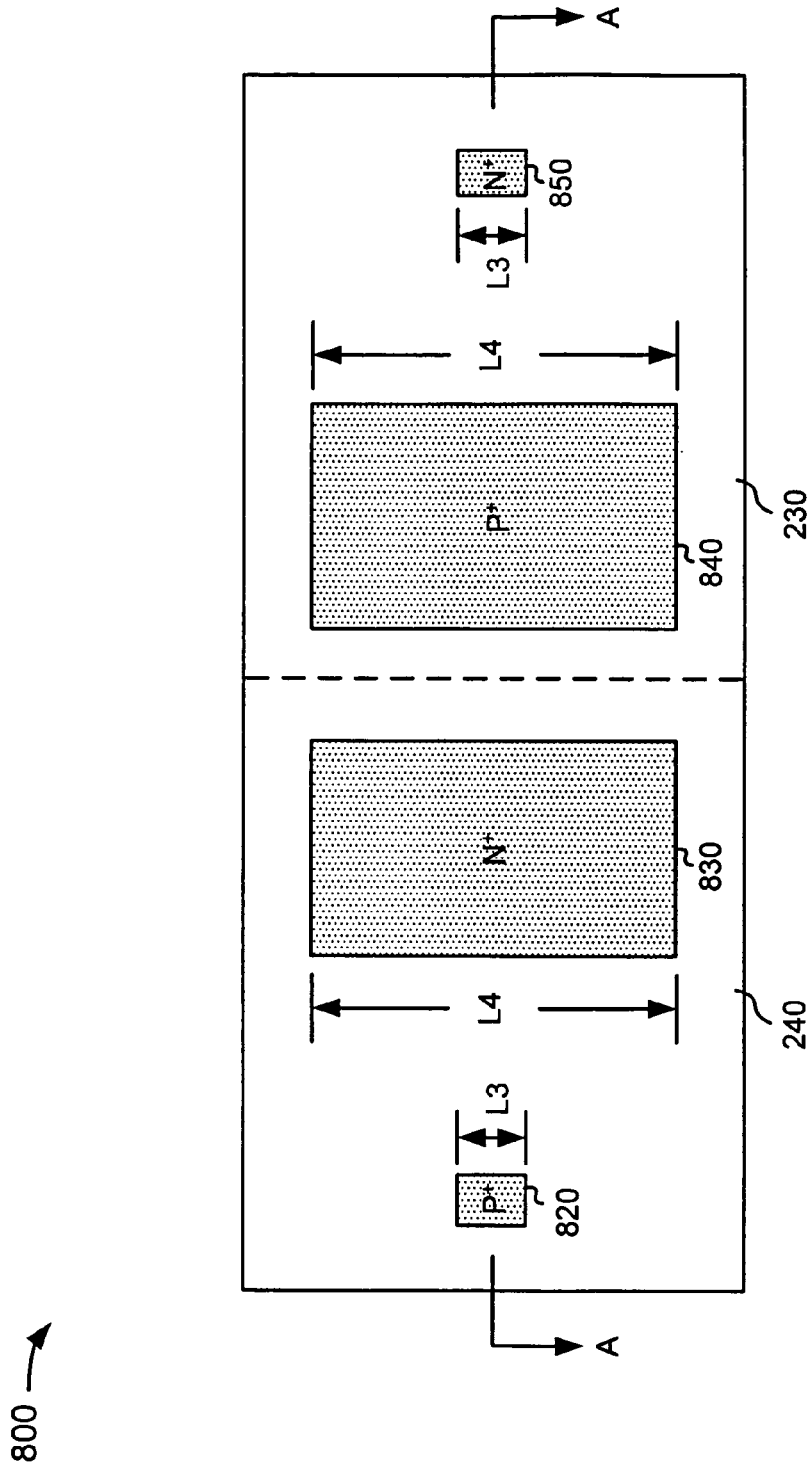

FIGS. 8A-8B illustrate exemplary views for forming a latchup monitor in a third exemplary implementation consistent with the principles of the invention. Processing may begin with a semiconductor device 800, as illustrated in FIG. 8A, that is formed in a mariner similar to semiconductor device 200 described above with respect to FIGS. 2-5. As set forth above with respect to FIGS. 2-5, a memory cell 310 may be formed on a top surface of a p-tub 240 formed in a layer 210. Source/drain regions 830 may be formed in p-tub 240 by implanting n-type impurities into p-tub 240. Also, a p-well contact region 820 may be formed in p-tub 240 by implanting p-type impurities into p-tub 240. A memory cell 310 may be formed on a top surface of an n-tub 230 formed in a layer 210. Source/drain regions 840 may be formed in n-tub 230 by implanting p-type impurities into n-tub 230. Also, an n-well contact region 850 may be formed in n-tub 230 by implanting n-type impurities into n-tub 230.

In the exemplary implementation illustrated in FIG. 8A and the top view illustrated in FIG. 8B, the source/drain regions are formed to a greater width and a greater length than the well contact regions. In this implementation, well contact regions 720 and 750 may be formed to a width of approximately 0.5 μm and source/drain regions 730 and 740 may be formed to a width ranging from about 10 μm to about 100 μm.

In one implementation, source/drain regions 730 and 740 may be formed to a width of approximately 10 μm.

Well contact regions 820 and 850, consistent with the invention, may be formed to a length ranging from about 0.3 μm to about 10 μm. In one implementation consistent with the principles of the invention, well contact regions 820 and 850 may be formed to a length (L3) of about 0.5 μm. Source/drain regions 830 and 840, consistent with the invention, may be formed to a length ranging from about 10 μm to about 100 μm. In one implementation consistent with the principles of the invention, source/drain regions 830 and 840 may be formed to a length (L4) of about 10 μm. A lateral distance between p-well contact region 820 and source/drain region 830 may range, for example, from about 10 μm and about 100 μm. A lateral distance between source/drain region 830 and source/drain region 840 may range, for example, from about 0.8 μm and about 10 μm. A lateral distance between source/drain region 840 and n-well contact region 850 may range, for example, from about 10 μm and about 100 μm.

Therefore, in this third exemplary implementation consistent with the principles of the invention, source/drain regions may be formed to a greater length and a greater width than well contact regions. The impact of this exemplary configuration on latchup may be analyzed. Similar to the implementation described above with respect to FIGS. 6A and 6B, this structure aids in determining the effectiveness of well contact regions in preventing latchup. In this exemplary implementation, the length (L3) of the well contact regions is fixed and the length and width of the source/drain regions are changed to determine a maximum size of the source/drain region that may be implemented without the effects of latchup.

Figure 9B:
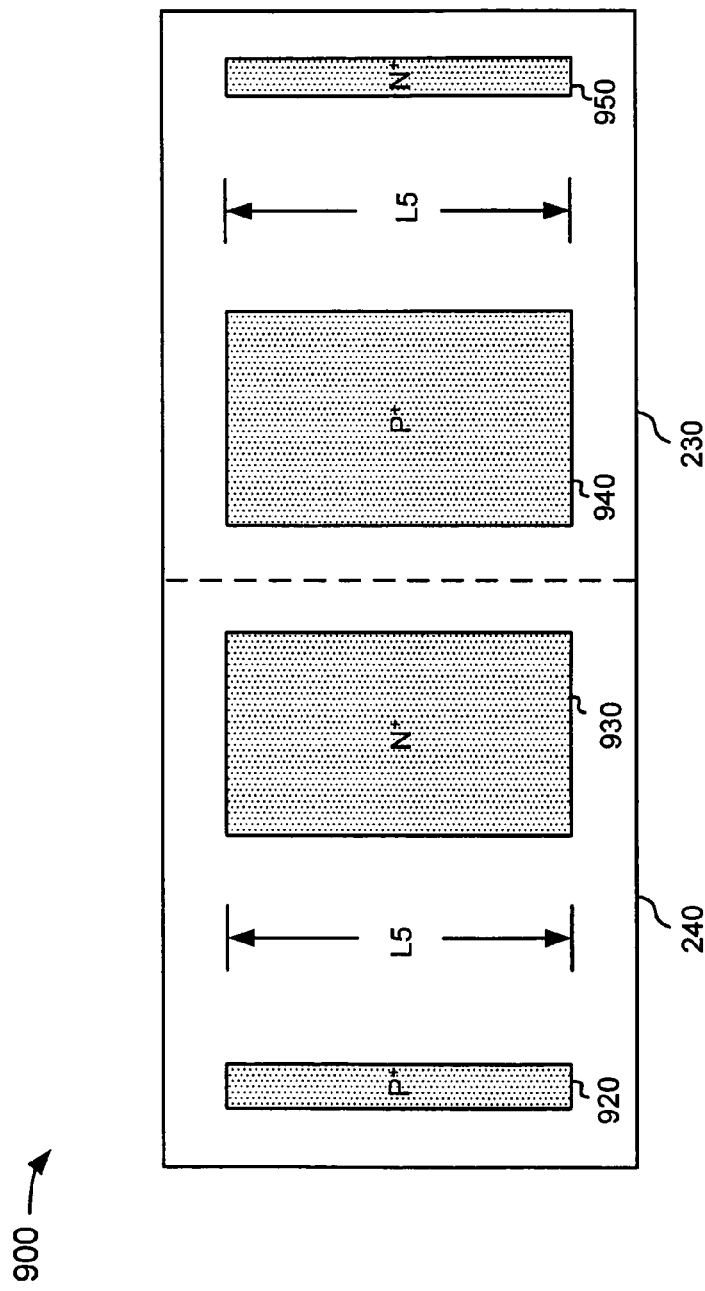

FIGS. 9A-9B illustrate exemplary views for forming a latchup monitor in a fourth exemplary implementation consistent with the principles of the invention. Processing may begin with a semiconductor device 900, as illustrated in FIG. 9A, that is formed in a manner similar to semiconductor device 200 described above with respect to FIGS. 2-5. As set forth above with respect to FIGS. 2-5, a memory cell 310 may be formed on a top surface of a p-tub 240 formed in a layer 210. Source/drain regions 930 may be formed in p-tub 240 by implanting n-type impurities into p-tub 240. Also, a p-well contact region 920 may be formed in p-tub 240 by implanting p-type impurities into p-tub 240. A memory cell 310 may be formed on a top surface of an n-tub 230 formed in a layer 210. Source/drain regions 940 may be formed in n-tub 230 by implanting p-type impurities into n-tub 230. Also, an n-well contact region 950 may be formed in n-tub 230 by implanting n-type impurities into n-tub 230.

In this exemplary implementation, as illustrated in FIG. 9A and the top view illustrated in FIG. 9B, the source/drain regions are formed to a greater width than the well contact regions. In this implementation, source/drain regions 930 and 940 may be formed to a length that is substantially similar to the length of well contact regions 920 and 950. Source/drain regions 930 and 940 and well contact regions 920 and 950 may be formed to a substantially same length ranging from, for example, about 0.8 μm to about 10 μm. In one implementation consistent with the principles of the invention, regions 920-950 may be formed to a length (L5) of about 10 μm.

In this exemplary implementation, source/drain regions 930 and 940 may be formed to a width that exceeds the width of well contact regions 920 and 950. For example, source/drain regions 930 and 940, consistent with the invention, may be formed to a width ranging from about 10 μm to about 100 μm. In one implementation consistent with the principles of the invention, source/drain regions 930 and 940 may be formed to a width of about 10 μm. Well contact regions 920 and 950, consistent with the invention, may be formed to a width ranging from about 10 μm to about 100 μm. In one implementation consistent with the principles of the invention, well contact regions 920 and 950 may be formed to a width of about 0.5 μm. A lateral distance between p-well contact region 920 and source/drain region 930 may range, for example, from about 10 μm and about 100 μm. A lateral distance between source/drain region 930 and source/drain region 940 may range, for example, from about 0.8 μm and about 2 μm. A lateral distance between source/drain region 940 and n-well contact region 950 may range, for example, from about 10 μm and about 100 μm.

Therefore, in this fourth exemplary implementation consistent with the principles of the invention, source/drain regions may be formed to a greater width than the well contact regions. The impact of this exemplary configuration on latchup may be analyzed. This structure aids in determining the effectiveness of the well contact region dimension for a large source/drain region. Therefore, for a fixed well contact region size, the maximum size of the source/drain region that can be implemented without latchup can be determined.

The above exemplary configurations may be analyzed to determine the effect of latchup when the dimensions of the well contact and source/drain regions are varied. Based on this analysis, semiconductor designs may be identified that allow for latchup to be controlled or even prevented. As a result, chip packaging density and circuit reliability may be improved.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the invention. However, implementations consistent with the invention can be practiced without resorting to the details specifically set forth herein. In other instances, well known processing structures have not been described in detail, in order not to unnecessarily obscure the thrust of the present invention. In practicing the invention, conventional deposition, photolithographic and etching techniques may be employed, and hence, the details of such techniques have not been set forth herein in detail.

While the foregoing description focused on a memory device, it will be appreciated that implementations consistent with the invention may be used to analyze the effect of latchup on other types of semiconductor devices.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method, comprising:
    forming a plurality of complementary metal oxide semiconductor (CMOS) circuits that include respective source/drain regions that differ in size and respective well contact regions of approximately same dimensions;
    analyzing the plurality of CMOS circuits; and identifying, based on analyzing the plurality of CMOS circuits, a CMOS circuit that includes a source/drain region of a maximum size and is without latchup.

2. The method of claim 1, where each of the source/drain regions includes a first length that is greater than a second length associated with a corresponding one of the well contact regions.

3. The method of claim 1,
where each of the source/drain regions includes a first length that is greater than a second length associated with a corresponding one of the well contact regions, and
where each of the source/drain regions includes a first width that is greater than a second width associated with a corresponding one of the well contact regions.

4. The method of claim 1, where:
each of the source/drain regions includes a first width that is greater than a second width associated with a corresponding one of the well contact regions.

\* \* \* \* \*